(12) United States Patent
Rubin et al.

(10) Patent No.: US 8,013,239 B2
(45) Date of Patent: *Sep. 6, 2011

(54) ELECTRODE FOR PHOTOVOLTAIC CELLS, PHOTOVOLTAIC CELL AND PHOTOVOLTAIC MODULE

(75) Inventors: Leonid B Rubin, Vancouver (CA); George L Rubin, Vancouver (CA)

(73) Assignee: Day4 Energy Inc., Vancouver, British Columbia (CA)

( * ) Notice: Subject to any disclaimer, the term of this patent is extended or adjusted under 35 U.S.C. 154(b) by 512 days.

This patent is subject to a terminal disclaimer.

(21) Appl. No.: 12/246,498

(22) Filed: Oct. 6, 2008

(65) Prior Publication Data

US 2009/0025788 A1 Jan. 29, 2009

Related U.S. Application Data

(63) Continuation of application No. 10/525,923, filed as application No. PCT/CA03/001278 on Aug. 21, 2003, now Pat. No. 7,432,438.

(30) Foreign Application Priority Data

Aug. 29, 2002 (DE) .................................. 102 39 845

(51) Int. Cl.
*H01L 31/00* (2006.01)

(52) U.S. Cl. .......................... 136/256; 136/244; 136/259
(58) Field of Classification Search .......... 136/243–265; 438/57–98
See application file for complete search history.

(56) References Cited

U.S. PATENT DOCUMENTS

| | | | |
|---|---|---|---|
| 3,982,964 A | 9/1976 | Lindmayer et al. |
| 3,996,067 A | 12/1976 | Broder |
| 4,027,652 A | 6/1977 | Collura |
| 4,080,703 A | 3/1978 | Beck, Jr. |
| 4,173,496 A | 11/1979 | Chiang et al. |
| 4,200,472 A | 4/1980 | Chappell et al. |
| 4,242,696 A | 12/1980 | Diguet et al. |

(Continued)

FOREIGN PATENT DOCUMENTS

DE 3927947 A1 2/1991

(Continued)

OTHER PUBLICATIONS

A translation of an Official Action mailed on Jun. 2, 2009 in connection with the Japanese Patent Application No. 2004-531327. This Japanese application corresponds to the subject U.S. Appl. No. 12/246,498.

(Continued)

*Primary Examiner* — Basia Ridley
*Assistant Examiner* — Tamir Ayad
(74) *Attorney, Agent, or Firm* — Knobbe, Martens, Olson & Bear, LLP

(57) ABSTRACT

An electrode for contacting an electrically conductive surface of a photovoltaic element includes an electrically insulating optically transparent film, an adhesive layer provided on a planar surface of the film, and a plurality of substantially parallel, electrically conductive wires embedded into the adhesive layer. The plurality of wires lies over the planar surface of the film. A part of the surfaces of the wires protrude from the adhesive layer. At least the part of the surfaces protruding from the adhesive layer are covered by a coating consisting of an alloy having a low melting point to solder the wires to the electrically conductive surface and to a first terminal bar. The adhesive layer has a thickness less than the thickness of the wires embedded therein.

24 Claims, 13 Drawing Sheets

U.S. PATENT DOCUMENTS

| | | |
|---|---|---|
| 4,256,513 A | 3/1981 | Yoshida et al. |
| 4,278,473 A | 7/1981 | Borden |
| 4,291,191 A | 9/1981 | Dahlberg |
| 4,315,096 A | 2/1982 | Tyan et al. |
| 4,320,154 A | 3/1982 | Biter |
| 4,330,680 A | 5/1982 | Goetzberger |
| 4,341,918 A | 7/1982 | Evans, Jr. et al. |
| 4,376,872 A | 3/1983 | Evans et al. |
| 4,380,112 A | 4/1983 | Little |
| 4,443,653 A | 4/1984 | Catalano et al. |
| 4,499,658 A | 2/1985 | Lewis |
| 4,517,403 A | 5/1985 | Morel et al. |
| 4,603,470 A | 8/1986 | Yamazaki |
| 4,628,144 A | 12/1986 | Burger |
| 4,667,060 A | 5/1987 | Spitzer |
| 4,697,041 A | 9/1987 | Okaniwa et al. |
| 4,703,553 A | 11/1987 | Mardesich |
| 4,735,662 A | 4/1988 | Szabo et al. |
| 4,933,021 A | 6/1990 | Swanson |
| 4,993,021 A | 2/1991 | Nannicini et al. |
| 5,009,720 A | 4/1991 | Hokuyo et al. |
| 5,011,567 A | 4/1991 | Gonsiorawski |
| 5,078,803 A | 1/1992 | Pier et al. |
| 5,084,107 A | 1/1992 | Deguchi et al. |
| 5,158,618 A | 10/1992 | Rubin et al. |
| 5,164,019 A | 11/1992 | Sinton |
| 5,223,044 A | 6/1993 | Asai |
| 5,248,347 A | 9/1993 | Ochi |
| 5,330,583 A | 7/1994 | Asai et al. |
| 5,389,158 A | 2/1995 | Fraas et al. |
| 5,391,236 A | 2/1995 | Krut et al. |
| 5,457,057 A | 10/1995 | Nath et al. |
| 5,474,620 A | 12/1995 | Nath et al. |
| 5,491,427 A | 2/1996 | Ueno et al. |
| 5,498,297 A | 3/1996 | O'Neill |
| 5,543,726 A | 8/1996 | Boyette et al. |
| 5,543,729 A | 8/1996 | Henly |
| 5,616,185 A | 4/1997 | Kukulka |
| 5,651,837 A | 7/1997 | Ohtsuka et al. |
| 5,681,402 A | 10/1997 | Ichinose et al. |
| 5,759,291 A | 6/1998 | Ichinose et al. |
| 5,871,591 A | 2/1999 | Ruby et al. |
| 5,909,124 A | 6/1999 | Madine et al. |
| 5,942,048 A | 8/1999 | Fujisaki et al. |
| 5,990,415 A | 11/1999 | Green et al. |
| 6,034,322 A | 3/2000 | Pollard |
| 6,077,091 A | 6/2000 | McKenna-Olson et al. |
| 6,091,021 A | 7/2000 | Ruby et al. |
| 6,093,882 A | 7/2000 | Arimoto |
| 6,121,542 A | 9/2000 | Shiotsuka et al. |
| 6,144,216 A | 11/2000 | Kajiwara et al. |
| 6,172,297 B1 | 1/2001 | Hezel et al. |
| 6,184,458 B1 | 2/2001 | Murakami et al. |
| 6,248,948 B1 | 6/2001 | Nakagawa et al. |
| 6,344,736 B1 | 2/2002 | Kerrigan et al. |
| 6,379,995 B1 | 4/2002 | Kawama et al. |
| 6,384,313 B2 | 5/2002 | Nakagawa et al. |
| 6,441,297 B1 | 8/2002 | Keller et al. |
| 6,452,086 B1 | 9/2002 | Müller |
| 6,541,695 B1 | 4/2003 | Mowles |
| 6,552,414 B1 | 4/2003 | Horzel et al. |
| 6,620,645 B2 | 9/2003 | Chandra et al. |
| 6,663,944 B2 | 12/2003 | Park et al. |
| 6,690,041 B2 | 2/2004 | Armstrong et al. |
| 6,741,087 B2 | 5/2004 | Kimura et al. |
| 6,756,290 B1 | 6/2004 | Bultman |
| 6,784,358 B2 | 8/2004 | Kukulka |
| 6,803,513 B2 | 10/2004 | Beernink et al. |
| 6,806,414 B2 | 10/2004 | Shiotsuka et al. |
| 6,807,059 B1 | 10/2004 | Dale |
| 6,825,104 B2 | 11/2004 | Horzel et al. |
| 6,982,218 B2 | 1/2006 | Preu et al. |
| 7,030,410 B2 | 4/2006 | Moore |
| 7,087,834 B2 | 8/2006 | McFarland |
| 7,115,504 B2 | 10/2006 | Moore et al. |
| 7,196,459 B2 | 3/2007 | Morris |
| 7,239,161 B2 | 7/2007 | Iwanaga et al. |
| 7,271,333 B2 | 9/2007 | Fabick et al. |
| 7,432,438 B2 | 10/2008 | Rubin et al. |
| 2001/0007262 A1 | 7/2001 | Matsushita et al. |
| 2001/0009159 A1 | 7/2001 | Watanabe et al. |
| 2002/0062828 A1 | 5/2002 | Nydahl et al. |
| 2002/0153039 A1 | 10/2002 | Moon et al. |
| 2002/0164834 A1 | 11/2002 | Boutros et al. |
| 2003/0000568 A1 | 1/2003 | Gonsiorawski |
| 2003/0134469 A1 | 7/2003 | Horzel et al. |
| 2004/0016456 A1 | 1/2004 | Murozono et al. |
| 2004/0089339 A1 | 5/2004 | Kukulka et al. |
| 2004/0112426 A1 | 6/2004 | Hagino |
| 2004/0123897 A1 | 7/2004 | Ojima et al. |
| 2004/0248336 A1 | 12/2004 | Shimizu |
| 2005/0087224 A1 | 4/2005 | McFarland |
| 2005/0172996 A1 | 8/2005 | Hacke et al. |
| 2005/0241692 A1 | 11/2005 | Rubin et al. |
| 2005/0257453 A1 | 11/2005 | Cinnamon |
| 2006/0022192 A1 | 2/2006 | Brabec et al. |
| 2006/0103371 A1 | 5/2006 | Manz |
| 2006/0130891 A1 | 6/2006 | Carlson |
| 2006/0255340 A1 | 11/2006 | Manivannan et al. |
| 2007/0068567 A1 | 3/2007 | Rubin |
| 2007/0095386 A1 | 5/2007 | Gibson |
| 2007/0102038 A1 | 5/2007 | Kirschning |
| 2007/0137692 A1 | 6/2007 | Carlson |
| 2007/0144577 A1 | 6/2007 | Rubin |
| 2008/0035198 A1 | 2/2008 | Teppe et al. |
| 2008/0072951 A1 | 3/2008 | Gabor |
| 2008/0092944 A1 | 4/2008 | Rubin |
| 2008/0290368 A1 | 11/2008 | Rubin |
| 2009/0025778 A1 | 1/2009 | Rubin |
| 2009/0205705 A1 | 8/2009 | Brendel et al. |
| 2009/0211628 A1 | 8/2009 | Engelhart et al. |
| 2010/0147368 A1 | 6/2010 | Rubin |
| 2010/0275976 A1 | 11/2010 | Rubin et al. |

FOREIGN PATENT DOCUMENTS

| | | |
|---|---|---|
| DE | 29720377 U1 | 5/1998 |
| DE | 19741832 A1 | 3/1999 |
| DE | 19752678 A1 | 6/1999 |
| DE | 19757150 A1 | 6/1999 |
| DE | 10132113 A1 | 3/2002 |
| DE | 10/239845 C1 | 12/2003 |
| DE | 102004050269 A1 | 4/2006 |
| DE | 102004053873 A1 | 5/2006 |
| DE | 102004061604 A1 | 6/2006 |
| DE | 102005001379 A1 | 7/2006 |
| DE | 102005040871 A1 | 10/2006 |
| DE | 102006013313 A1 | 9/2007 |
| DE | 102006009112 A1 | 2/2008 |
| DE | 102007011749 A1 | 3/2008 |
| DE | 102006047579 A1 | 4/2008 |
| DE | 102007003682 A1 | 8/2008 |
| DE | 102007035883 A1 | 2/2009 |
| DE | 102007054384 A1 | 5/2009 |
| DE | 102007059486 A1 | 6/2009 |
| DE | 102007059490 A1 | 6/2009 |
| DE | 102008030880 A1 | 6/2009 |
| DE | 102008013068 A1 | 9/2009 |
| DE | 102008015157 A1 | 9/2009 |
| EP | 0542478 | 3/1996 |
| EP | 0807980 A | 11/1997 |
| EP | 0905794 A2 | 3/1999 |
| JP | 59115576 A2 | 7/1984 |
| JP | 01206671 A2 | 2/1988 |
| JP | 07321351 A | 12/1995 |
| JP | 2000243990 | 9/2000 |
| JP | 2005191479 | 7/2005 |
| WO | WO 2004/021455 A1 | 3/2004 |
| WO | WO 2006042698 A1 | 4/2006 |
| WO | WO 2006048319 A2 | 5/2006 |
| WO | WO 2006111304 A1 | 10/2006 |
| WO | WO 2006/123938 A1 | 11/2006 |
| WO | WO 2007/071064 A1 | 6/2007 |
| WO | WO 2007107339 A1 | 9/2007 |
| WO | WO 2009062882 A2 | 5/2009 |
| WO | WO 2009074466 A1 | 6/2009 |
| WO | WO 2009074468 A2 | 6/2009 |
| WO | WO 2009074469 A2 | 6/2009 |

OTHER PUBLICATIONS

Gee, James M. et al., "Emitter wrap-through solar cell," Sandia National Laboratories, Albuquerque, New Mexico, pp. 265-270.

Rohatgi et al., "Self-aligned self-doping selective emitter for screen printed solar cells," Photovoltaics Conference Papers, 2001.

Van Kerschaver, Emmanuel et al., "Back-contact solar cells: A review," Progress in Photovoltaics: Research and Applications, 2006, vol. 14, pp. 107-123, published online Dec. 20, 2005, in Wiley InterScience (www.interscience.wiley.com) DOI: 10.1002/pip.657.

Rubin, et al., "one-Axis PV Sun Concentrator Based on Linear Nonimaging Fresnel Lens", International Conference on Solar Concentrators for the Generation of Electricity or Hydrogen, May 15, 2005, Scottsdale, Arizona, USA.

Vasu et al., "Photovoltaic properties of indium tin oxide/silicon junctions prepared by spray pyrolysis—dependence on oxidation time," Semiconductor Science & Technology, 1992, vol. 7, pp. 320-323.

"cetisPV-Contact1 Contacting Station for Solar Cells," H.A.L.M. Electronik, http://ww.halm.de/English/Prospekte/Pvcontact/cetisPVContact1_main.html.

Raabe et al., "High Aspect Ration Screen Printed Fingers," Proc. of the 20$^{th}$ European Photovoltaic Solar Energy Conference, Jun. 6-10, 2005, Barcelona, Spain.

Hoornstra et al., "The Importance of Paste Rheology in Improving Fine Line, Thick Film Screen Printing of Front Side Metallization," Proc. of the 14th European Photovoltaic Solar Energy Conference, Jun. 30-Jul. 4, 1997, Barcelona, Spain.

Burgers et al., "Interruption Tolerance of Metallization Patterns," Proc. of the 12$^{th}$ European Photovoltaic Solar Energy Conference, Apr. 11-15, 1994, Amsterdam, The Netherlands.

Hammud et al., "Monolithically Series-Connected Crystalline SI Wafer Cells for Portable Electronic Devices," 31$^{st}$ IEEE Photovoltaic Specialists Conference 2005, IEEE Catalog No. 05CH37608C; ISBN 0-7803-8708-5.

"Wiring solar modules and batteries," http://www.partsonsale.com/learnwiring.htm from Feb. 6, 2003, available from www.archive.org.

http://www.sandia.gov/pv/docs/PVFarraysConcentrator_Collectors.htm.

http://www.inspira.es/newroom.981130.html.

http://www.spectrolab.com/DataSheets/TerCel/PV_Concentrator_Module.pdf.

International Search Report dated Nov. 21, 2008, for International Application No. PCT/CA2008/001391.

International Search Report dated Sep. 8, 2008, for PCT/CA2007/002301.

Official Communication in Korean Patent Application No. 520050056406 dated Apr. 27, 2010.

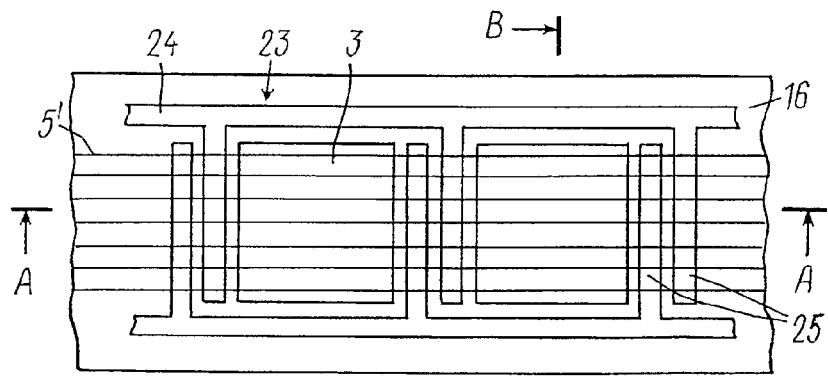
FIG. 10A
FIG. 10B
FIG. 10C
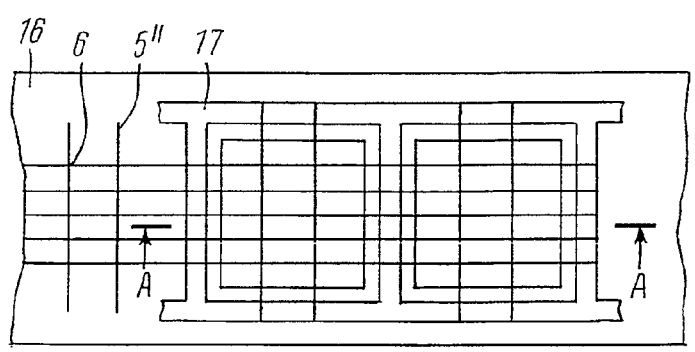
FIG. 11A
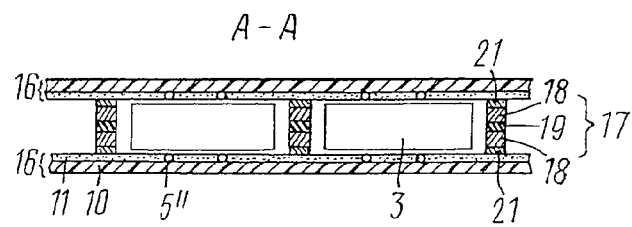
FIG. 11B

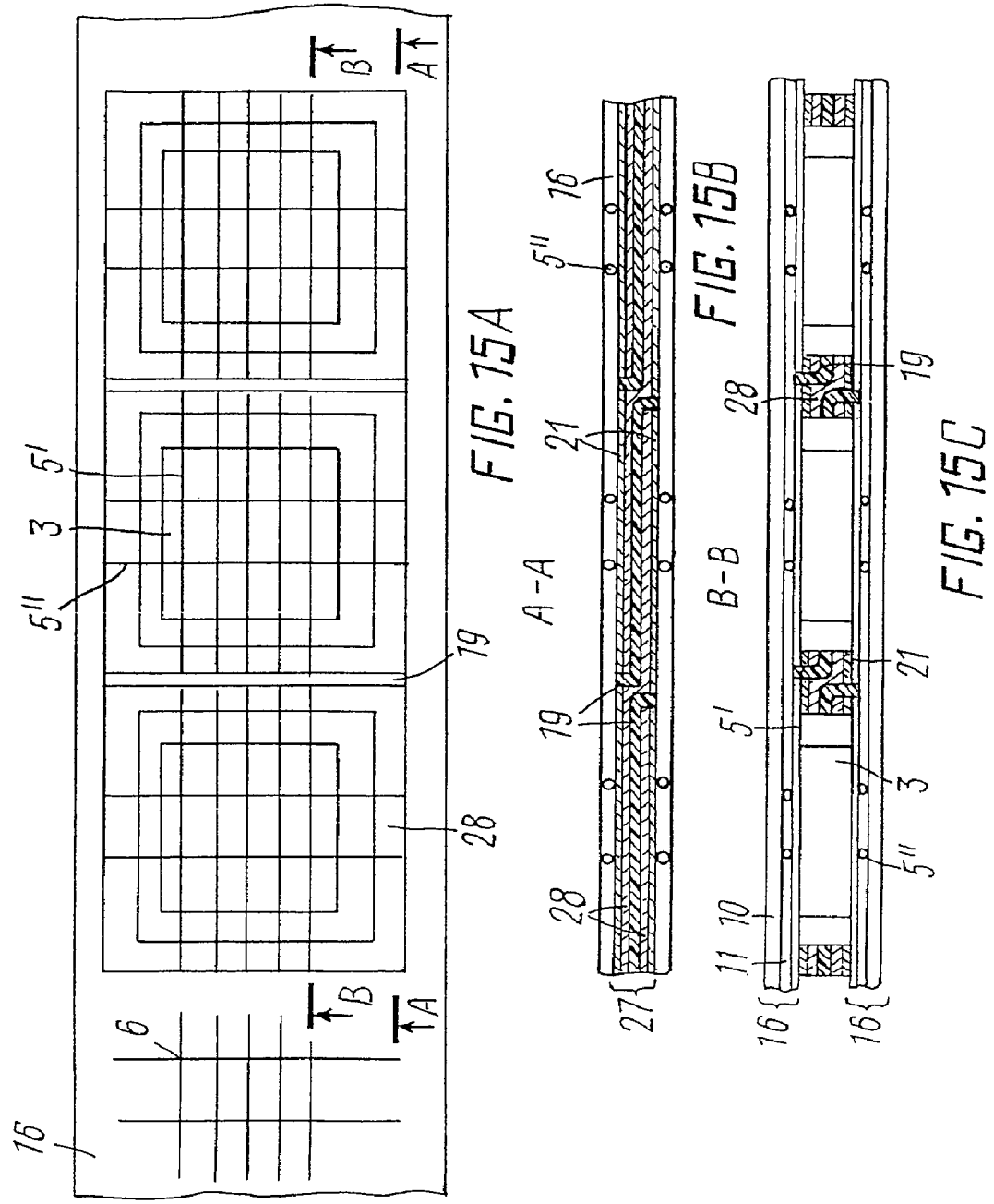

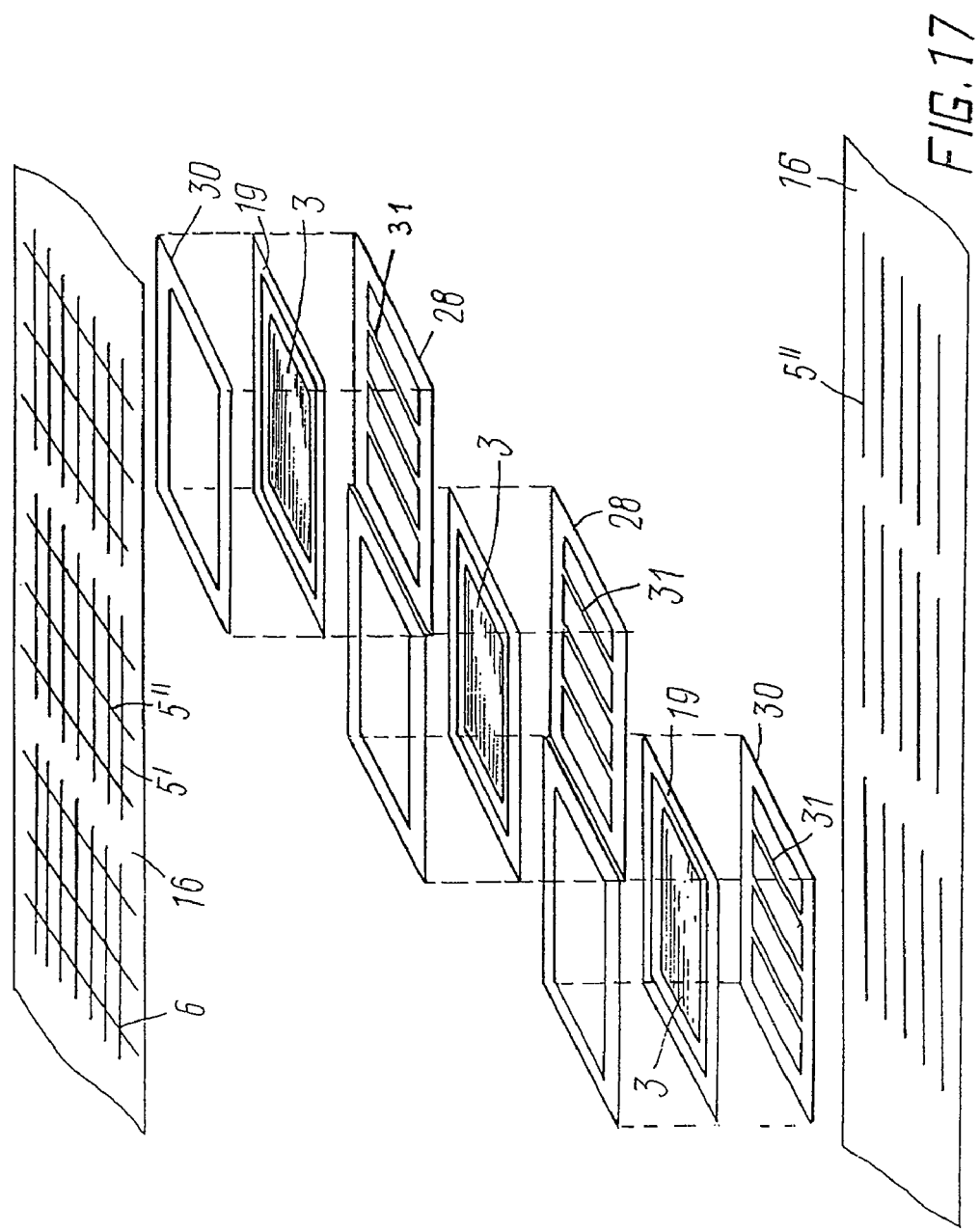

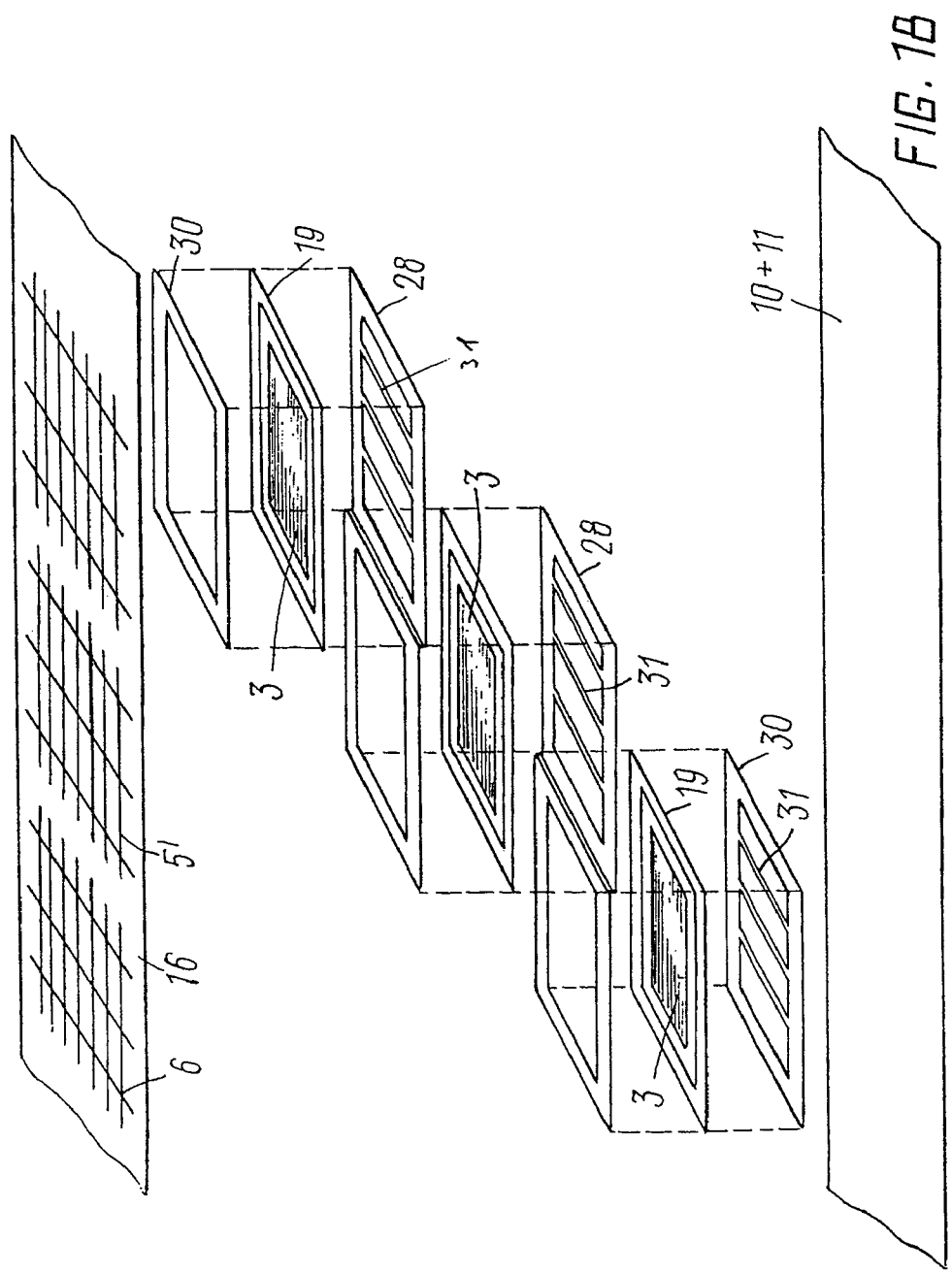

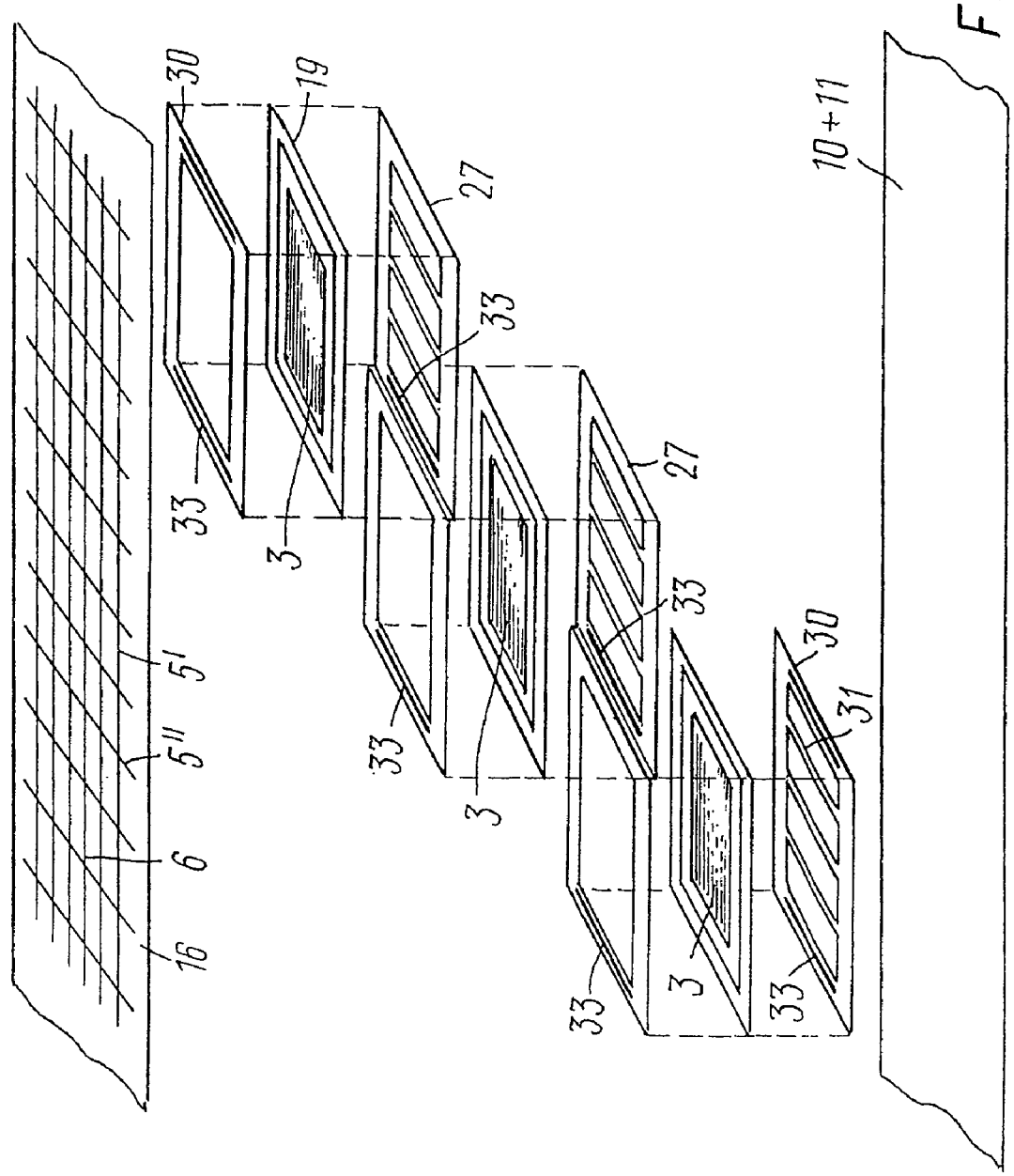

ELECTRODE FOR PHOTOVOLTAIC CELLS, PHOTOVOLTAIC CELL AND PHOTOVOLTAIC MODULE

CROSS-REFERENCE TO RELATED APPLICATIONS

This application is a continuation of U.S. patent application Ser. No. 10/525,923, which is the National Phase of International Application No. PCT/CA2003/001278 filed Aug. 21, 2003, which in turn claims priority to German Application No. 102 39 845.3 filed Aug. 29, 2002.

BACKGROUND

The invention relates to an electrode for contacting electrically conductive surfaces, in particular for contacting one or a plurality of photovoltaic (PV) elements that are a part of a photovoltaic cell or solar cell. The invention further relates to photovoltaic cells produced with this electrode.

The generation of electrical energy using photovoltaic technology has reached a high standard. However, the production of PV cells and PV modules is still rather complicated and expensive. Also the efficiency of energy generation using PV modules is rather low, with a maximum efficiency of about 17 percent. From an economic point of view the generation of electric power using photovoltaic technology is only acceptable under current conditions if it is supported and/or subsidized by some means, e.g., by the so called 100 000-roofs program in Germany or similar programs in California, USA. Thus, in the field of photovoltaic technology there still remains a critical need to lower the production costs and enhance the efficiency of the energy generation using PV elements and PV modules.

Commonly used PV cells comprise a semiconductor element with a junction of the type ($n^+n$(or $p$)$p^+$) on the basis of mono- or multicrystalline silicon, amorphous silicon, and other thin-film semiconductors with an embedded p-n junction. One surface of the element is usually covered with a metal layer, such as aluminum or stainless steel, while the other surface has an anti-reflective coating. Both surfaces are in contact with electrodes, which collect and carry off the generated electrical energy. This structure is embedded between transparent protective layers, such as glass.

The electrodes are all produced using screen-printing technology. However, electrodes produced this way have a high series resistance. Apart from this, expensive devices and equipment are required for the production, and cost reduction is limited when this technology is employed.

U.S. Pat. No. 5,759,291 to Inchinose et al. discloses a semiconductor element (wafer) with parallel metallic contact or current collecting wires (electrodes) fixed to the surface of the element by means of a conductive adhesive in which conductive particles are dispersed. These electrode wires are arranged in parallel between connecting conductors which run along the edges of the element. For this type of electrode the ohmic contact resistance between the semiconductor surface and the wires is relatively high, which results in a high energy loss and a low efficiency, especially under concentrated solar radiation. Also, the production of such PV cells is rather complicated.

U.S. Pat. No. 5,084,107 to Deguchi et al. discloses a similar solar cell and array of solar cells, wherein metallic electrode wires are adhered to the surface of the photovoltaic element by means of an adhesive material. Conductive particles are dispersed in the adhesive. In addition, with this electrode structure, the production costs and the contact resistance between the wires and the surface of the element are fairly high.

U.S. Pat. No. 5,158,618 to Rubin et al. discloses an electrode structure, wherein the contact wires are embedded in a transparent polymer block in such a way that they partly protrude from the polymer block. Said electrodes contact the element from one or two sides and are sandwiched between transparent protective layers, such as glass. Since the wires of the electrode are, for example, configured as coils, there are only point contacts between the wires and the surface of the PV element. Thus, the series resistance of a PV cell is relatively high in this case as well. Also, the production costs are relatively high, since the automated production of such types of solar cells and PV modules is not possible.

SUMMARY

An objective of the invention is, therefore, to provide an electrode which achieves a lower contact resistance between the electrodes and a conductive surface, in particular the surface or surfaces of a photovoltaic element, at low production costs.

A further objective of the invention is to provide a PV cell which allows, by using such an electrode, lowering the combined series resistance and production costs of PV cells and PV modules and allows enhancement of their efficiency.

The invention achieves these objectives by providing an electrode for contacting an electrically conductive surface, in particular for contacting at least one surface of a photovoltaic element, the electrode comprising an electrically insulating optically transparent film, an adhesive layer provided on one surface of said film, and a first plurality of substantially parallel, electrically conductive wires embedded into the adhesive layer, a part of the surfaces of said wires protruding from the adhesive layer and at least on the surface protruding from the adhesive layer covered by a coating consisting of an alloy with a low melting point, wherein the wires of the first plurality are electrically connected to a first terminal bar.

Preferably, a second plurality of wires running substantially parallel to each other is disposed between the transparent film and the wires of said first plurality, the wires of the first and second pluralities forming a mesh, wherein the wires of the second plurality are electrically connected to a second terminal bar.

In a further preferred embodiment, the first and second terminal bars are electrically connected to each other.

The terminal bar(s) may be provided at the respective ends of the wires. In this embodiment the terminal bar(s) are preferably provided at opposite ends of the wires of the first or the first and second pluralities of wires outside the contour of the photovoltaic element, wherein the wires are to be connected to its surface.

The first and second terminal bars are preferably connected to form an angle.

In a further preferred embodiment the terminal bars are formed as a U-formed frame, wherein the wires of one of the two pluralities are connected to the base and the wires of the other plurality are connected to the free legs of the U.

In the embodiment where the terminal bar(s) are provided at opposite ends of the wires of the first or of the first and second pluralities the terminal bars preferably extend over the length of two adjacent photovoltaic elements to be connected and a step is provided in their center, so that a plurality of terminal bars can be fit together to form one row, in which one half of a terminal bar is arranged below or above the lower or upper halves, respectively, of the neighboring terminal bar, wherein an insulating film is provided between the terminal bars.

Further, the terminal bars may be formed as a closed frame, the open area (window) of said frame exceeding the dimensions of the corresponding photovoltaic element.

It is a further preferred embodiment to form the terminal bar(s) as a double frame with two adjacent windows, the open area of which exceeds the dimensions of the corresponding photovoltaic elements.

The frame may comprise two metallic frames with an insulating film provided between them.

In a further preferred embodiment a step is provided in the central bar of the double frame, so that a plurality of frames can be fit together to form one row, in which one half of a double frame is arranged below or above the lower or upper halves, respectively, of the neighboring double frame.

A slot can be provided in the central bar of the double frame, wherein said slot runs parallel to said step, so that upon completion of a PV module the traversing wires of the electrode can be cut.

Finally, metallic bars may be arranged to span over at least one window of the frame(s), wherein said bars are integrally connected with the corresponding metallic frame.

The invention further achieves the above objectives by providing a plurality of electrodes according to any of the embodiments described above wherein the electrodes are formed as an endless, continuous strip which can be cut to a length corresponding to the length of an array of adjacent photovoltaic elements to be connected to form a PV module, wherein the wires running in the longitudinal direction of the strip are cut at distances corresponding to the distances of the PV cells.

Preferably, an endless terminal bar may be provided along at least one of the edges of the transparent film, wherein preferably comb-like terminal bars are arranged along each edge of the transparent film, the teeth of which reach respectively from one side between two adjacent photovoltaic elements over the width of the wires of the first plurality and alternately are in electrical contact with the upper and lower sides of corresponding photovoltaic elements and are isolated from the other surface.

The invention further achieves the above objectives by providing a PV cell or a PV module comprising at least one electrode or one electrode strip according to any of the preceding embodiments, comprising one or more photovoltaic cells with an electrically conductive, antireflective, optically transparent coating on at least one of its surfaces, wherein the wires of the first plurality are soldered onto the coating and onto the respective terminal bars or terminal frames by means of the alloy.

When the wires of the first and second pluralities are arranged to form a mesh the wires of the first and second pluralities are preferably bonded together at their crossing points and onto the respective terminal bars or terminal frames by means of the alloy.

The electrode provides for an intimate and reliable ohmic contact with the surface to be contacted and achieves an 8 to 10 times lower combined series resistance of a PV cell or PV module, which not only improves the PV elements' efficiency but allows them to operate under 8 to 10 times more concentrated solar radiation. This refers particularly to those embodiments in which the wires of the first and second pluralities are arranged with respect to each other in the form of a mesh and are connected to angularly- or rectangularly-formed connecting conductors. Simultaneously, during production the degree of automation and the throughput capacity may be substantially increased.

BRIEF DESCRIPTION OF THE DRAWINGS

In the following, the invention is explained in more detail by the embodiments illustrated in the drawings.

FIG. 10A is a view of several PV cells being arranged in the form of a strip, in which the PV cells are connected to each other in parallel, FIG. 10B shows the section A-A of FIG. 10A, FIG. 10C shows the section B-B of FIG. 10A, FIG. 11A is a view of several PV cells in the form of a strip and with electrodes forming a mesh, in which the cells are connected to each other in parallel, FIG. 11B shows the section A-A of FIG. 11A, FIG. 15A is a view of an array of PV cells arranged in series in the form of a strip, FIG. 15B shows the section A-A of FIG. 15A, FIG. 15C shows the section B-B of FIG. 15A, FIG. 17 is a schematic exploded view of the elements of a PV module with series-connected PV cells, FIG. 18 shows a further embodiment of a PV module similar to that of FIG. 17, and FIG. 19 shows a further embodiment of a PV module similar to that of FIGS. 17 and 18.

DETAILED DESCRIPTION OF THE PREFERRED EMBODIMENTS

Figure 1:
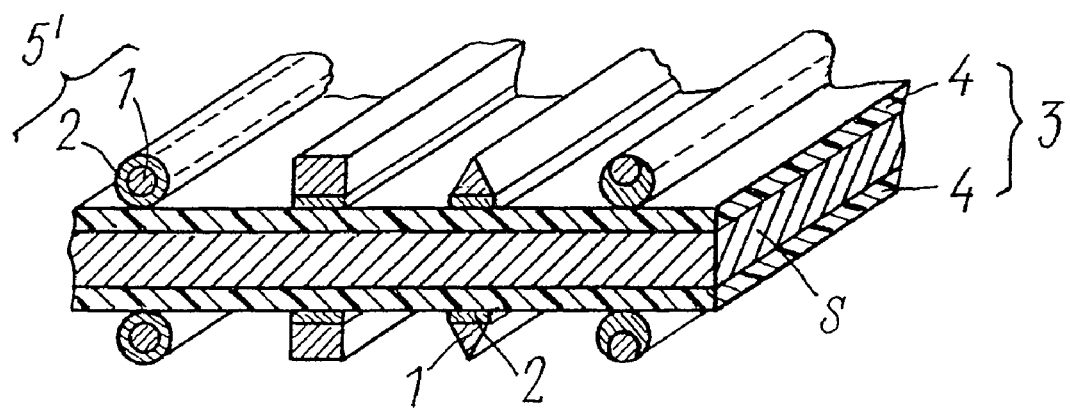
FIG. 1 is a schematic isometric partial view of a PV cell before a heating and/or pressing step during the production of a PV cell.

FIG. 1 shows a semiconductor structure S, for example Silicon($n^+$n(or p)$p^+$), the upper surface of which (always in relation to the depiction in the figure) is covered with an anti-reflective, transparent, electrically conductive coating 4 such as, for example, Indium-Tin-Oxide (ITO). The element S can also consist of a thin-film PV element. The lower surface of the element S is coated either with a metal coating (e.g., aluminum) or alternatively with an anti-reflective, transparent, electrically conductive coating 4. The element S and the upper coating 4, together with the metal coating (not depicted) or the second, lower ITO-coating 4, form a unit, hereinafter referred to as a wafer 3. The two surfaces of the wafer 3 are in contact with the metallic wires 1, which are coated with a coating 2 consisting of an alloy having a low melting point. The wires 1 may be completely coated with the alloy coating 2 or only partly coated on the side or sides facing the surface to be contacted. In the following, the coated wires are referred to as a first plurality of wires 5'. They are in direct contact with the surface or surfaces of the wafer 3.

Figure 2:
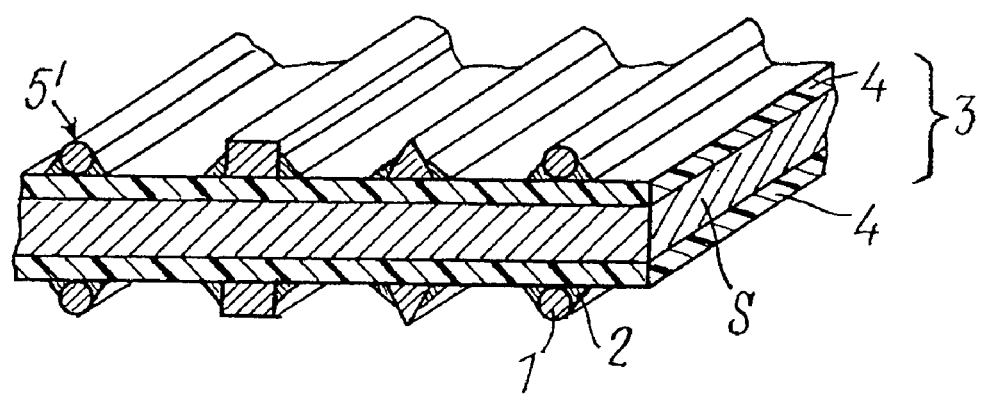
FIG. 2 is a schematic isometric partial view of a PV cell after a heating and/or pressing step during the production of a PV cell.

FIG. 2 shows the arrangement of FIG. 1 after pressing and heating up to 120°. The material of the alloy coating 2 has slightly softened and wetted the coating 4, and is in ohmic contact with said coating and the wires 5'. This also refers to the case in which the lower side of the element S does not have an anti-reflective, transparent, conductive coating 4, but rather has a metal coating. The distance of the wires 5' does not have to be uniform, i.e., the parallel wires 5' may be arranged in pluralities of two or more wires 5' with different distances between the wires and the wires of a plurality.

The cross-sectional form and size of the wires are chosen to optimize the electric current collection by the wires, the current density in the wires, the series resistance of the PV cell, and the size of the wafer area shadowed by the wires 5'. As shown in FIGS. 1 and 2, different cross-sectional forms may be chosen for the wires 5', for example circular, rectangular, triangular, etc. Of course, for the wires 5' of a particular PV cell or PV module respectively only one cross-sectional form is chosen.

Figure 3:
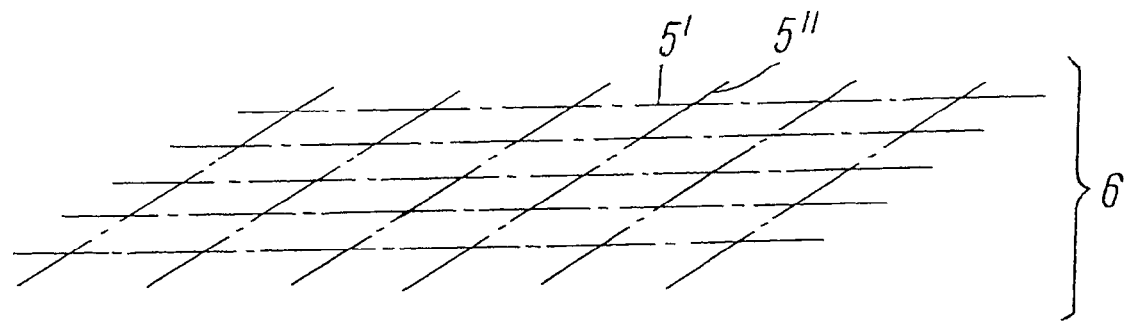
FIG. 3 is a schematic isometric view of a mesh of contact wires.

FIG. 3 shows a wire mesh 6 of wires 5' of the first and wires 5" of a second plurality, wherein the wires 5' and 5" of the first and second pluralities are usually running perpendicularly to each other. The wires 5" are, at least on the surfaces facing the wires 5', also covered with an alloy coating 2. However, if the amount of alloy material on the wires 5' of the first plurality is sufficient for a safe mechanical and electrical connection of the two pluralities of wires at the crossing points, the alloy coating on the wires 5" of the second plurality can be omitted. The same considerations made for the arrangement and size of the wires 5' also apply to the choice of the distances of the wires 5" and of the cross-sectional form and area. Of course, for the wires 5" a cross-sectional form and size different from that of the wires 5' can be chosen.

Figure 4:
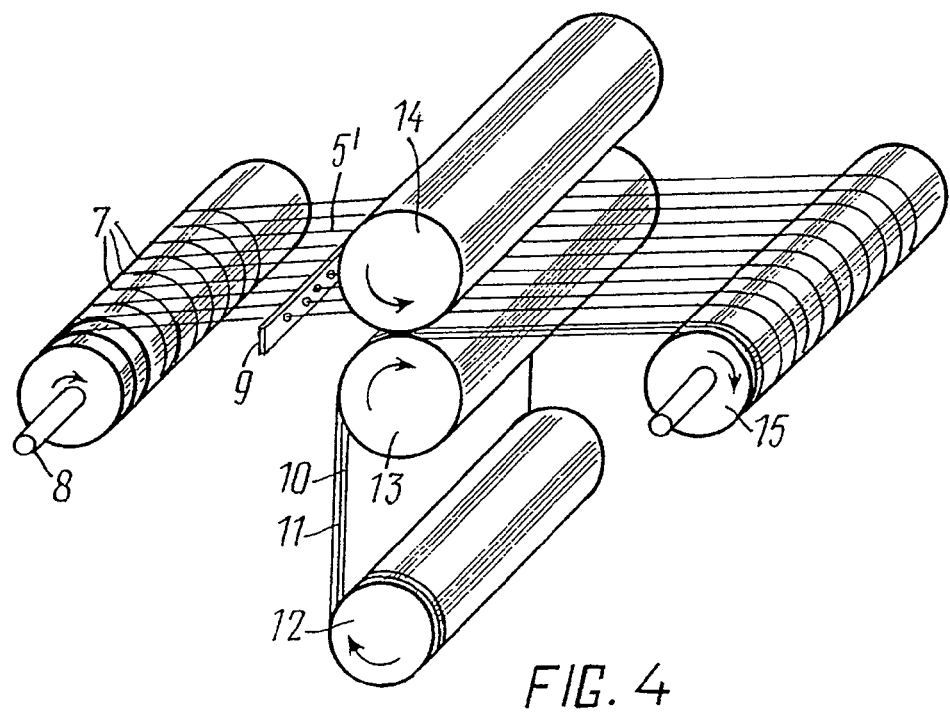
FIG. 4 is a schematic isometric view of a device for producing film-type adhesive optically transparent electrodes.

FIG. 4 shows the schematic view of a device for producing a film-type adhesive optically transparent electrode. Initially, the alloy-coated wires 5' are wound up on several rolls 7, wherein the number of rolls equals the width of the PV cell divided by the required distances between the parallel running wires 5' of the first plurality. For example, at a PV cell width of 100 mm and a distance between the wires of 4 mm, 26 rolls 7 are required. The rolls 7 are fastened on an axis 8, so that it is possible to form parallel lines of wires 5', which are running through corresponding openings in a frame 9. The distance between the openings in the frame 9 is determined by the requested distance between the parallel wires 5'. The size and form of the openings in the frame 9 must correspond to the size and form of the cross-sectional area of the wires 5'.

Figure 5A:
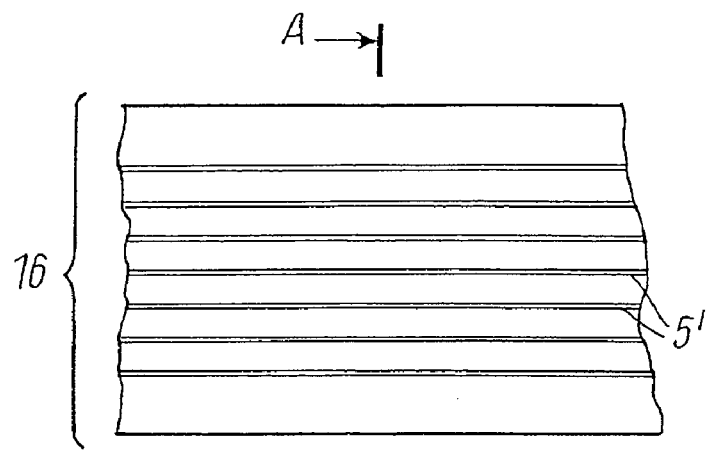
FIG. 5A is a view of an electrode produced with the device of FIG. 4.

The parallel wires 5' are disposed on a polymeric film 10, which is supplied from a drum 12. The surface of the film 10 facing the wires 5' is coated with a transparent adhesive 11. The overall width of the film 10, on which the wires 5' are placed, exceeds the width of one or an array of several wafers 3, so that on each side of the film 10 a zone of 1.5 to 2 cm remains free of wires 5' (FIG. 5A). The film 10 is lead by the drum 12 over the surface of a rotatable roller 13 and is pulled by a drum 15, simultaneously pulling the wires 5'. The wires 5' are pressed on the film 10 by means of another roller 14 arranged above the rotatable roller 13. Simultaneously, the film 10 is heated by the rollers 13 and 14, so that the adhesive 11 softens, the wires 5' immerse in the adhesive 11 and, after cooling down, remain fixed to the film 10 and embedded in the adhesive 11. The opposite side of the polymeric film should preferably be primed by adhesive material to allow further PV cell encapsulation between protective layers.

Figure 5B:
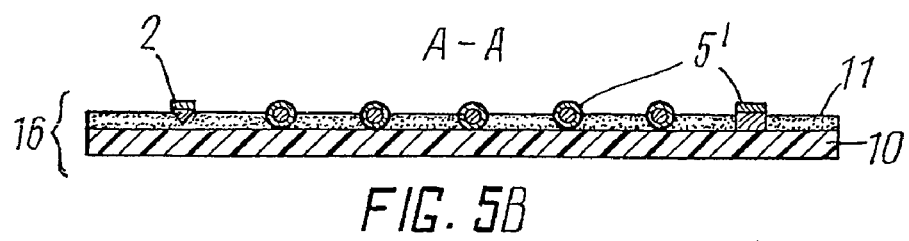
FIG. 5B shows the cross-section A-A of FIG. 5A.

FIGS. 5A and 5B show in detail the result of this process, namely a transparent electrode 16. The wires 5' extending along the polymeric film 10 are embedded in the adhesive 11 and pressed onto the film 10. A part of the surface of the wires 5' is protruding from the surface of the adhesive 11. In FIG. 5B, on the left and right-hand other possible cross-sectional forms of the wires 5' are again depicted.

Figure 5C:
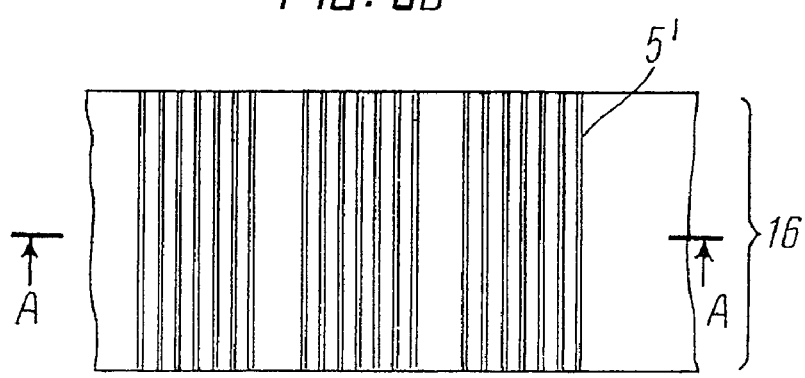
FIG. 5C is a view of an electrode strip with wires running transversely to the direction of the wires of FIG. 5A.
Figure 5D:
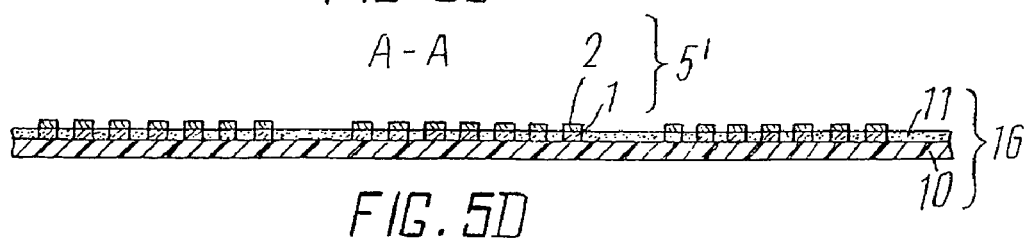
FIG. 5D shows the cross-section A-A of FIG. 5C.

A production device similar to that of FIG. 4 may be used for producing a polymeric film 10 wherein embedded wires 5' are transversely arranged to the initial direction of the film 10 (FIGS. 5C and 5D). The width of the polymeric film 10 hereby has to correspond to the required length of a PV cell or PV module. After the wires 5' of the first plurality are embedded in the film 10, it may be cut into pieces transverse to the initial extension of the film 10.

The distance of the wires 5' and/or 5" is not required to be uniform, i.e., the parallel wires 5' and/or 5" can be arranged in groups of two or more wires with different distances between the wires in each group and number of such groups.

Figure 6A:
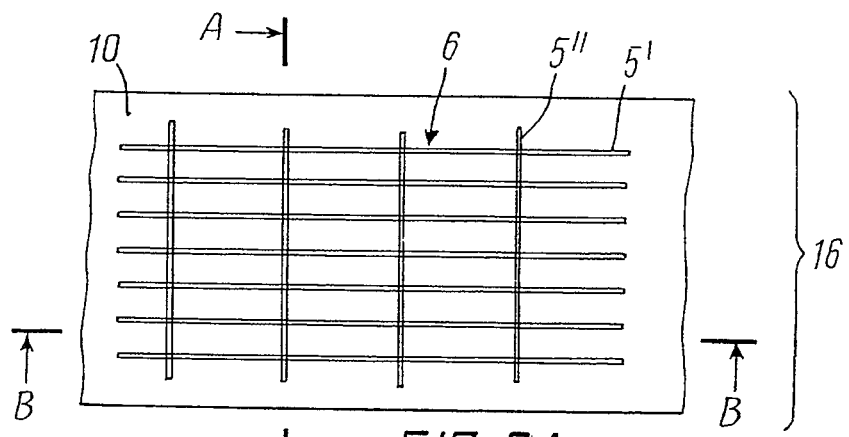
FIG. 6A shows the view of an electrode strip with a wire mesh.
Figure 6B:
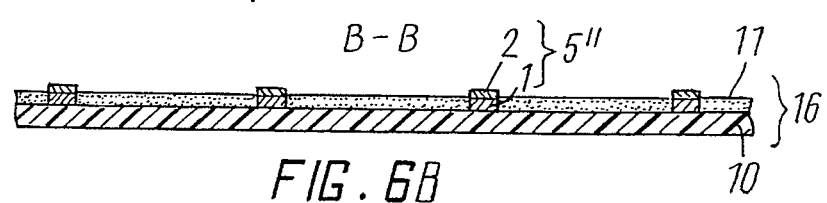
FIG. 6B shows the cross-section B-B of FIG. 6A.
Figure 6C:
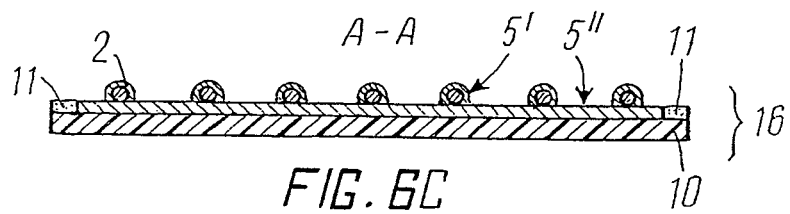
FIG. 6C shows the cross-section A-A of FIG. 6A.

FIG. 6A shows an electrode 16 comprising the transparent polymeric film 10 and a wire mesh 6 of the wires 5' and 5" of the first and second pluralities. Only the wires 5" that are located closer to the polymeric film 10 are immersed in the adhesive 11 (see also FIGS. 6B and 6C). The upper or outer wires 5' operable to contact the surface or surfaces of the wafer 3 are not, at least not completely, immersed in the adhesive 11 (during the production of this type of an electrode 16 the roll 7 carries a wire mesh 6, and frame 9 is not used (FIG. 4)). At this point, the wires 5' and 5" may already be soldered together. However, usually this is done at the time of assembly of the electrode 16 and the wafer 3.

For the polymeric film 10 a wide range of materials may be used: the material must have a high ductility, good insulating characteristics, optical transparency and thermal stability, resistance to shrinkage, and have good adhesive ability. Examples of such materials are Cellophane®, rayon, acetate, fluororesin, polysulfone, epoxy resin, and polyamide resin. Another suitable material is the transparent polymeric film Mylar®. Preferably the materials are those based on a fluoropolymer; for example the polyvinyl fluoride film Tedlar® and the modified ETFE fluoropolymer resin Tefzel®. These materials are used not only in photovoltaic industry but also for general purposes and for electrotechnical products for lamination purposes.

A wide range of materials that have a softening temperature ranging from about 90-110° C. and a good adhesion to preliminarily-primed polymeric films and the surface of the wafer 3 are suitable as adhesive 11. Preferred materials are acrylic adhesive materials, rubber adhesive materials, silicon adhesive materials, polyvinyl ether adhesive materials, and epoxy adhesive materials. Most preferably, the materials used are Ethylene Vinyl Acetate, for example, supplied by HI-SHEET INDUSTRIES, LTD. or by DuPont, namely 68080 Polymethyl methacrylate, 68040 Methacrylate copolymer, or 68070 Methacrylate copolymer.

The adhesive layer 11 must be sufficiently thick to provide for a reliable connection of the electrode with the wafer 3. The thickness of the adhesive layer should, however, not exceed the thickness of the wires 5', so that the part of the wires 5' protruding from the adhesive 11, which is coated with the alloy 2 and is not immersed in the adhesive 11, can later form a direct ohmic contact with the electrically conductive surface of the wafer 3 (FIGS. 5A, 5D, 6B, and 6C).

The polymeric film 10 must be sufficiently thick to be sufficiently stable when the adhesive 11 is applied and when it is pulled under pressure and heat when attaching the wires 5' and 5". Simultaneously, it should be as thin as possible in order to achieve high elasticity and transparency for the light passing through it. Preferably, the thickness of the polymeric film 11 ranges between 10 and 50 µm. As noted above, it is preferable for the opposite side of polymeric film to be primed with adhesive material.

In FIGS. 5 and 6 the polymeric film 10 is shown with the adhesive 11 and the wires 5' (or the mesh 6 with the wires 5' and 5") with the alloy coating 2 protruding from the surface of the adhesive 11 forming a continuous or endless film-type optically transparent adhesive electrode 16.

The electrode 16 may be used for the production of PV cells and PV modules. Different types of metallic rods or bars and connections are required in order to collect the current from the electrode 16 and transmit it further. It is advisable to attach the metallic rods or bars to the electrode 16 using drops of glue or brief local heating, thus bonding or fixing the metallic rods or bars to the adhesive 11 of the electrode 16. The distance between the metallic bars and different types of connections must be designed to provide enough space between the wafers 3 so that they will not come into direct electrical contact with the constructional elements when they thermally expand under up to 160° C. heating during the assembly of the wafer 3 and the electrode 16.

Figure 7:
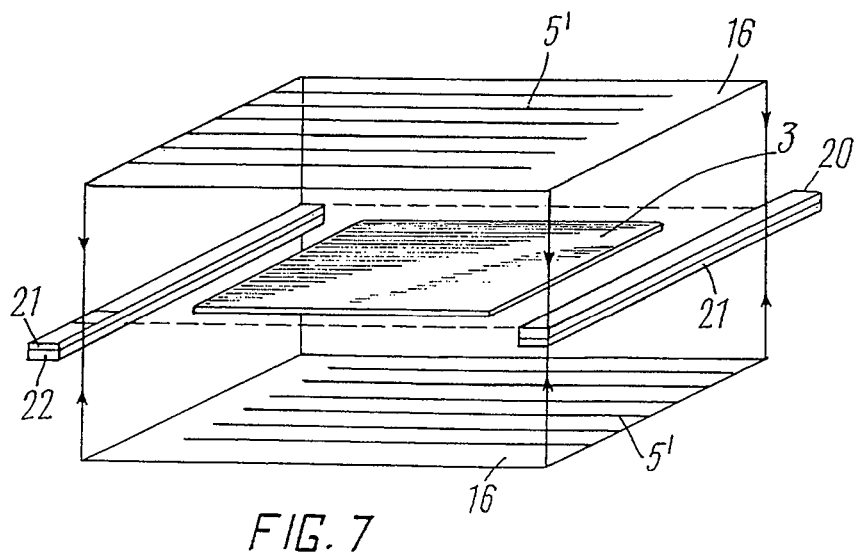
FIG. 7 shows in a schematic isometric exploded view the essential elements of a PV cell before heating and pressing.

FIG. 7 shows a drawn out depiction of a PV cell before its assembly by means of pressing and heating. Electrodes 16 are respectively disposed above and below the wafer 3. At two opposite sides of the wafer 3 in a direction transverse to the longitudinal extension of the wires 5' of the electrodes 16 are disposed a first terminal bar 20 and a second terminal bar 22, which are provided on their lower or upper sides, respectively, with a coating 21 consisting of an electrically conductive alloy with a low melting point. The wires 5' of the upper electrode 16 extend from the right border of the wafer 3 up to the left edge of the second terminal bar 22. In reverse, the wires 5' of the lower electrode 16 extend from the left edge of the wafer 3 to the right edge of the first terminal bar 20. After heating and pressing, the wires 5' of the upper electrode 16 are in ohmic contact with the left, second terminal bar 22 and the upper surface of the wafer 3, while the wires 5' of the lower electrode 16 are in ohmic contact with the lower side of the terminal bar 20 and the lower side of the wafer 3.

The electrically conductive alloys 2 and 21 with a low melting point may be represented either by common solders or specially developed ones on the basis of different metals, like Ag, Bi, Cd, Ga, In, Pb, Sn, Ti, etc. It is also possible to use an electroconductive material composed of organic adhesives with metallic or alloy particles.

Figure 8:
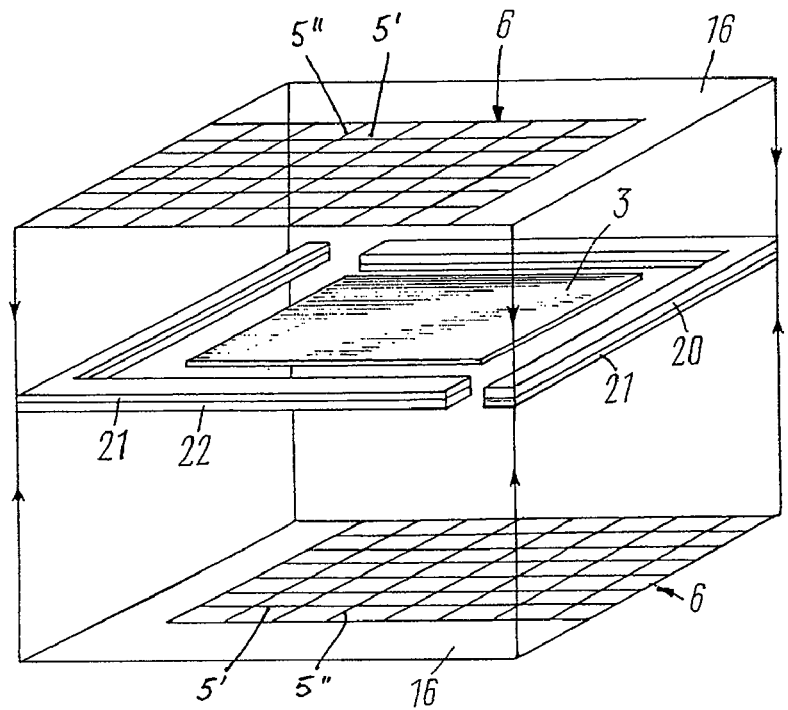
FIG. 8 is a schematic isometric exploded view of a second embodiment of the elements of a PV cell before heating and pressing.

FIG. 8 shows a similar structure, however with angularly formed terminal bars 20 and 22 and electrodes 16 with wires 5' and 5" arranged in the form of a mesh 6. After pressing and heating, the mesh 6 of the lower electrode 16 is in ohmic contact with the right, first angularly formed terminal bar 20 and the lower side of the wafer 3, while the mesh 6 of the upper electrode 16 is in ohmic contact with the second angularly formed terminal bar 22 and the upper side of the wafer 3.

Figure 9A:
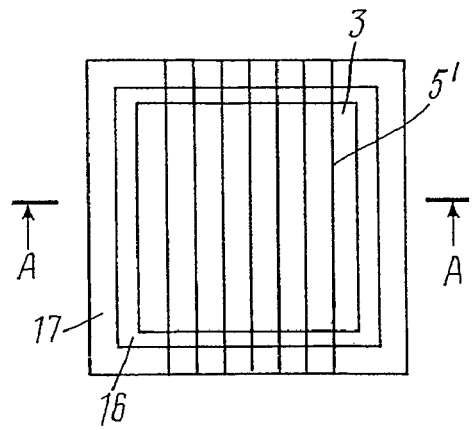
FIG. 9A is a view of a third embodiment of a PV cell.
Figure 9B:
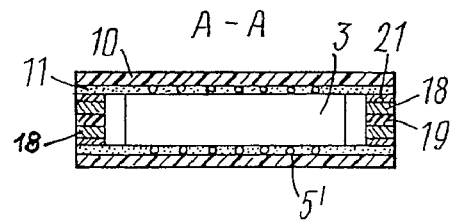
FIG. 9B shows the cross-section A-A of the photovoltaic element of FIG. 9A.

FIGS. 9A and 9B show a PV cell, wherein the terminal bars are configured in the form of a three-layered laminated frame 17, wherein the corresponding wafer 3 is accommodated in the frame's window. The wires 5' run between two opposite sides of the frame 17, wherein they are soldered onto the sides by heating and pressing.

As shown in more detail in FIG. 9B, the frame 17 comprises two metallic frames 18, wherein a preferably double-sided adhesive insulating film 19 is disposed between them. On the outer sides of the two frames 18, respectively, a conductive alloy coating 21 is applied. This coating may be omitted when the amount of the material on the wires 5' is sufficient for a reliable ohmic contact between the frame 17 and the wires 5'. In this case it is recommended that the frame 17 should be tinned.

This embodiment is also suitable for use with an electrode 16 in the form of a mesh, wherein the wires 5" of the second plurality (not shown) run perpendicular to the wires 5' of the first plurality and are in ohmic contact with the corresponding sides of the frame 17 depicted in FIG. 9.

The following embodiments illustrate how an array of PV cells may be connected in series and parallel to each other, with the help of the electrode 16 produced in the form of an endless strip, thereby constituting PV modules.

FIGS. 10A, 10B, and 10C show an endless electrode 16 with comb-like terminal bars 23, wherein the wires 5' run in parallel to them in the direction of the longitudinal extension of the endless electrode 16 outside the longitudinal bars 24. The longitudinal bars 24 are integrally connected with transversely running transverse bars 25 (the "teeth" of the comb), which are protruding into the spaces between the wafers 3 from one or the other direction, respectively.

As shown in FIG. 10B (cross section A-A of FIG. 10A), the upper surfaces of the left transverse bars 25 are provided with an insulating film 19, while a coating 21 consisting of an electrically conductive alloy is applied on the lower surface. For the right transverse bars 25 the insulating film 19 is deposited on the lower surface and the coating 21 consisting of a conductive alloy is deposited on the upper surface.

FIG. 10C shows the cross section B-B of FIG. 10A.

In the embodiment shown in FIGS. 10A through 10C the PV cells are connected in parallel with each other, since the respective left transverse bars 25 are electrically connected to the lower sides of the wafers 3 and the respective right transverse bars 25 are electrically connected with the upper side of the wafers 3 located on the right side of them.

FIGS. 11A and 11B show an embodiment in which the PV cells parallel connections similar to FIGS. 9A and 9B are configured in the form of a three-layered frame 17, which is laminated from an endless array of metallic frames 18 arranged in series and an insulating polymeric film 19 arranged between these frames 18. A conductive coating 21 melting at low temperatures is deposited on the outer sides of the frames 18. This coating 21 is in ohmic contact with the wires 5' and 5" of the electrode 16.

In this embodiment the wafers 3 are positioned within the "windows" of frame 17 and the PV cells are connected in parallel to each other by means of the upper and lower electrodes 16.

Figure 12A:
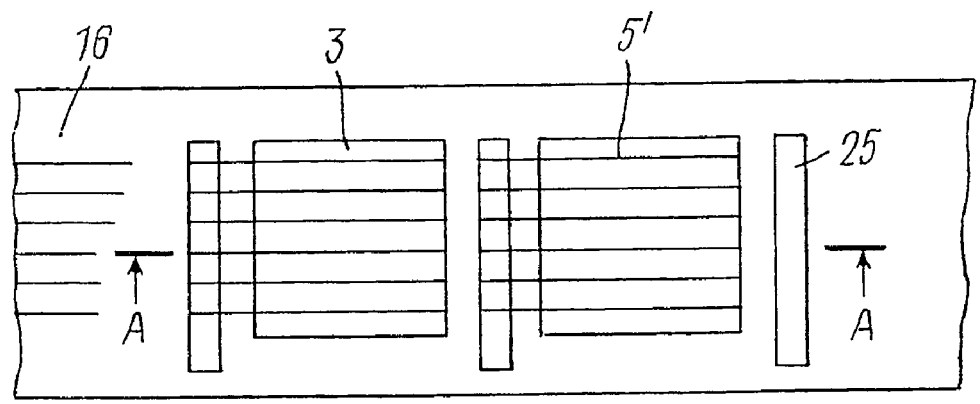
FIG. 12A shows a further embodiment of an array of PV cells being arranged in the form of a strip in which PV cells are connected in series.
Figure 12B:
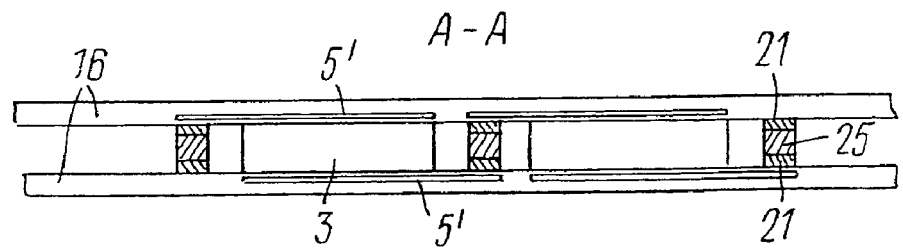
FIG. 12B shows the section A-A of FIG. 13A.

FIGS. 12A and 12B show a series connection of several PV cells. The terminal bars 25 running transverse to the longitudinal extension of the electrode 16, with periodically interrupted wires 5', are provided with a coating 21 on their upper and lower sides, respectively. The wires 5' of the upper electrode 16 thereby provide ohmic contact between the upper side of a terminal bar 25 and the upper side of the wafer 3 arranged on the right side thereof, whereas the wires 5' of the lower electrode 16 provide ohmic contact between the lower side of each terminal bar 25 and the lower side of the wafer 3 arranged on the left side thereof.

Figure 13:
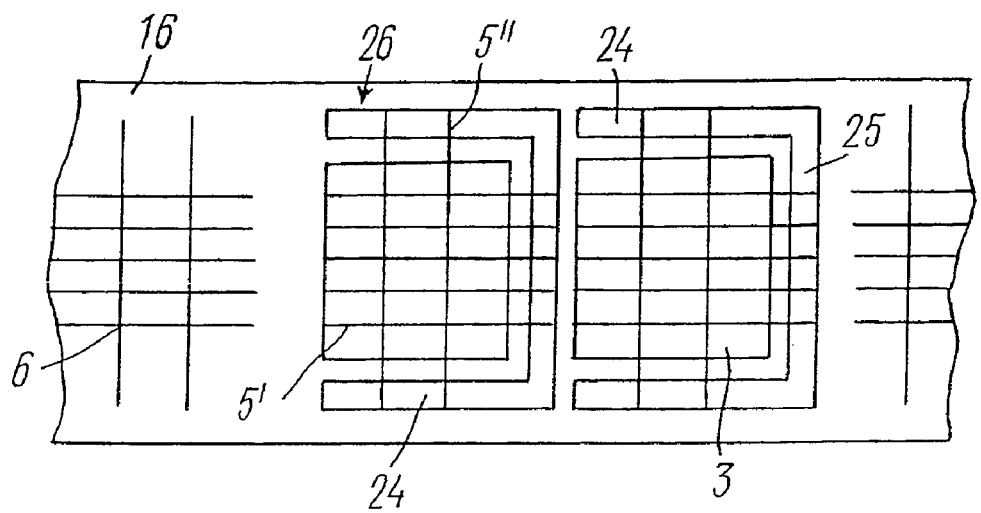
FIG. 13 is a view of a further embodiment of an electrode strip with electrode wires arranged in the form of a mesh, wherein the PV cells are also connected to each other in series.

FIG. 13 shows an endless electrode 16, wherein the PV cells' series connection is accomplished by means of U-formed metallic terminal bars 26. Bars 24 of the terminal bars running in the longitudinal direction are in ohmic contact with the wires 5", and the transverse bars 25 thereof running in a transverse direction to the electrode 16 are in ohmic contact with the wires 5'. The wafers 3 are positioned within the space of the U-formed metallic terminal bars 26 and between the upper and lower electrodes 16.

The connections of the wafers 3 with wires 5' are similar to that shown in FIG. 12B.

Figure 14A:
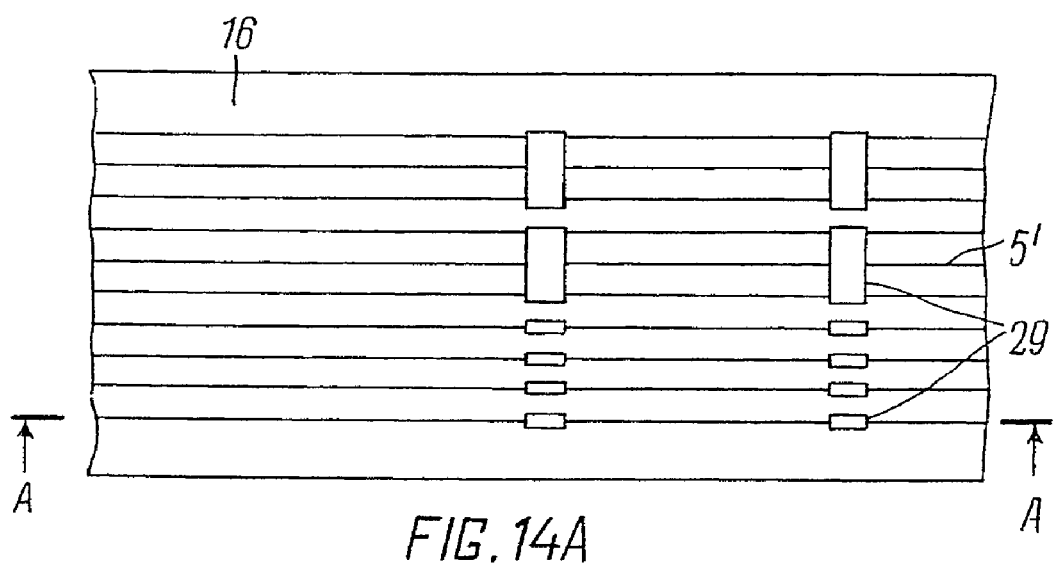
FIG. 14A is a view of an endless electrode with single electrode sections for forming one PV cell, respectively.
Figure 14B:
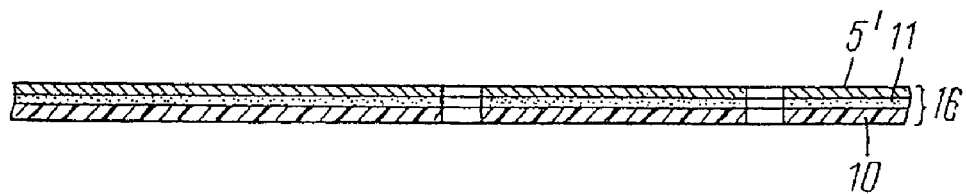
FIG. 14B shows the section A-A of FIG. 12A.

FIGS. 14A and 14B show an electrode 16 as it may be used for the PV cells' series connection as depicted in FIGS. 12A and 12B and analogously for the arrangement of FIG. 13. The wires 5' are each interrupted by perforations 29, which include either only one wire 5' or several wires 5', respectively. Of course, the electrode 16 remains more solid when the perforations 29 interrupt only one wire 5', compared with the case where several neighboring wires are perforated. In the latter case it is recommended that a strip of transparent adhesive polymeric film (not shown) be applied on the perforated part of the electrode 16 in a direction transverse to the longitudinal extension of the electrode 16.

Similarly, in the embodiment of FIG. 13 the terminal bars 24 running in the longitudinal direction may also be interrupted, along with the wires 5'.

Thus, on the lower and upper side of wafer 3 respectively, identical electrodes 16 may be used, which are shifted with respect to each other only by the width of the distance between the transverse bars 25 and the edge of the next wafer 3.

A different construction of the connections for carrying off the electrical energy is described with reference to FIGS. 15 through 19.

The basic element of the arrangement according to FIG. 15 is a laminated three-layered double frame 27 comprising two metallic frames (preferably copper foil) 28 and an insulating film 19 provided between these frames. A step is provided in the central bar of double frame 27 and parallel thereto. The height of said step corresponds to the thickness of the metal foil, i.e., about 0.2 to 0.3 mm (FIGS. 15A, 15B, and 15C). As seen from FIG. 15B, the metallic frames 28 are superposed in positions shifted with respect to each other, i.e., the left upper part of a metallic frame 28 is arranged above the right lower part of the left adjacent frame 28. The insulating film 19 provided between the two superposing metallic frames 28 of adjacent double frames 27 is bent at its ends in an upward or downward direction and extends up to the surface of the frame 27 construction. The wafers 3 are positioned within the "windows" of frame 27. The wires 5' of the upper and lower perforated electrodes 16 are in ohmic contact with the surfaces of the wafer 3, and the respective left and right bars of each of the frame windows. The wires 5" are electrically connected with the wires 5' and the respective upper and lower bars of the frames. The surfaces of the metallic frames 28 in contact with the wires 5' are, if necessary, coated with an alloy coating 21 having a low melting point or are just tinned.

Thus, it is possible to serially interconnect an array of PV cells of any number.

Figure 16A:
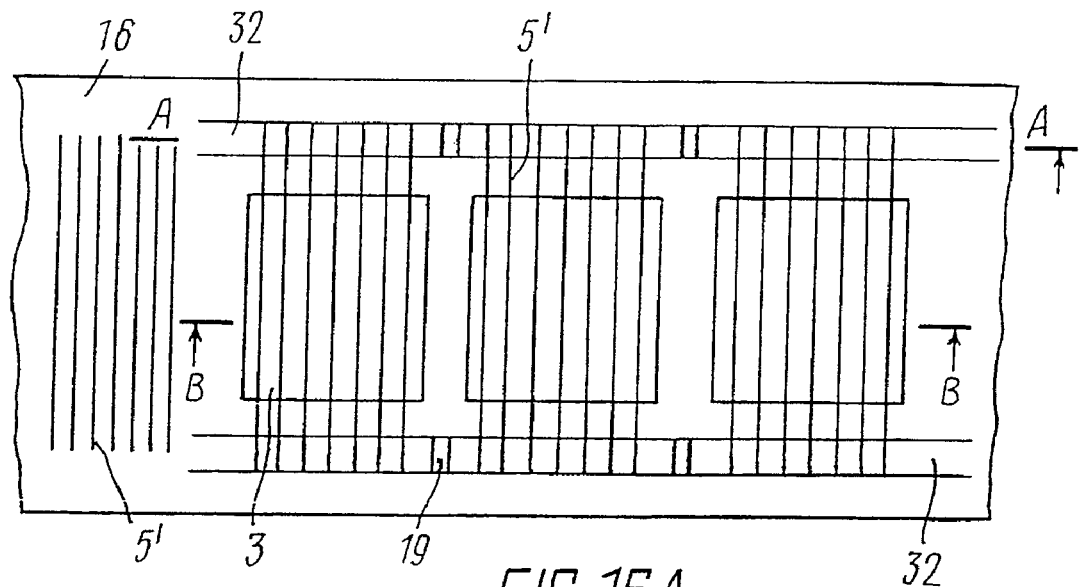
FIG. 16A shows a further embodiment of several PV cells arranged in series in the form of a strip.
Figure 16B:
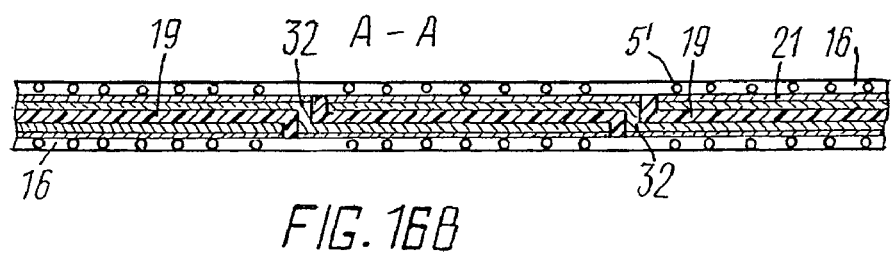
FIG. 16B shows the section A-A of FIG. 16A.
Figure 16C:
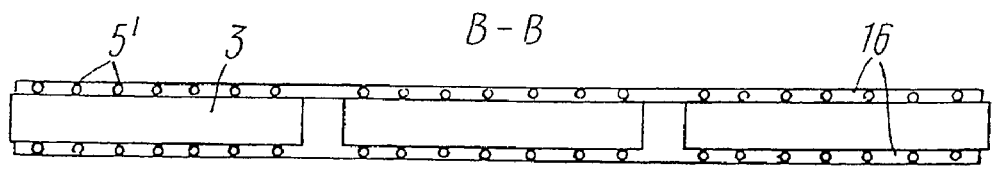
FIG. 16C shows the section B-B of FIG. 16A.

FIGS. 16A, 16B, and 16C show a similar, but substantially simplified, construction wherein the non-perforated electrode 16 corresponds to that shown in FIGS. 5C and 5D. In this case longitudinal bars 32 with a step are utilized. These longitudinal bars 32 are lined up like the frames 28 depicted in FIGS. 15B and 15C.

FIG. 17 shows two superposed metallic frames 28 with a step in the middle and arranged in positions shifted with respect to each other, representing a whole array. The special feature of this arrangement is that the transverse bars 31 span over the respective right lower windows, wherein said bars 31 are integrally connected with the metallic frame 28. In this embodiment, the bars 31 take over the function of the wires 5' of the lower electrode 16 of this invention, i.e., in the completed PV cell they are in ohmic contact with the respective lower surface of the wafer 3 located above them.

In order to complete the endless array of series-connected PV cells, simple frames 30 are provided at their ends, wherein the simple frame 30 provided for at the left end of the array is also provided with bars 31.

The construction is completed by an upper electrode 16 with electrode meshes 6, the wires 5' of which are perforated and are connected after heating and pressing with the upper surface of the wafer 3 and frames 28 and 30. The lower electrode 16 has perforated wire 5" sections or wire 5" fields running in a longitudinal direction, wherein said wire sections or wire fields are connected in the completed PV cell with the bars 31 and the frame 30. Here they take over the function of the wires 5", i.e., of the wires only indirectly connected with the lower surface of wafer 3.

FIG. 18 shows an embodiment similar to that of FIG. 17, wherein instead of the lower electrode 16 a transparent polymeric film 10 is provided to which an adhesive 11 is applied.

Finally, in FIG. 19 an embodiment is shown similar to that depicted in FIGS. 17 and 18. The upper electrode 16 has an uninterrupted mesh 6. A slot 33 is provided so that the wires 5' of the electrode 6 can be perforated after the completion of series connection of the PV cells in the left bar, in the central bar of the frame 28, and in the left and right bars of the upper and lower frame 30. This slot 33 runs parallel to the step. These slots 33 allow for the wires 5' of the upper electrode 16 to be cut throughout after assembly of the PV module. The width of slot 33 is set such that the wires 5' remain permanently interrupted and isolated from each other after perforation.

What is claimed is:

1. An electrode for contacting an electrically conductive surface of a photovoltaic element, the electrode comprising:
    an electrically insulating optically transparent film having a planar surface;
    an adhesive layer on said planar surface;
    a plurality of substantially parallel, electrically conductive wires lying over said planar surface of said film and embedded into said adhesive layer, said adhesive layer having a thickness less than a thickness of said wires embedded therein, such that a part of the surfaces of said wires protrudes from said adhesive layer; and ohmic contact means for causing said part of the surfaces of said wires protruding from said adhesive layer to make ohmic contact with the electrically conductive surface of the photovoltaic element;

said adhesive layer being operable to adhesively secure said film to said electrically conductive surface while said ohmic contact means causes said part of the surfaces of said wires protruding from said adhesive layer to make ohmic contact with the electrically conductive surface of the photovoltaic element.

2. The electrode of claim 1, wherein said ohmic contact means comprises a coating on said part of the surfaces of said wires protruding from said adhesive layer, said coating comprising an alloy having a low melting point, operable to solder said part of the surfaces of said wires protruding from said adhesive layer to the electrically conductive surface of the photovoltaic element.

3. The electrode of claim 1, wherein said film is sufficiently thick to be drawn and to support said adhesive layer and wherein said film is sufficiently thin to have elasticity.

4. The electrode of claim 3, wherein said film has a thickness of between about 10 micrometers to about 50 micrometers.

5. The electrode of claim 1, wherein said wires embedded into said adhesive layer extend generally parallel to a longitudinal axis of said film.

6. The electrode of claim 1, wherein said wires embedded into said adhesive layer extend generally perpendicularly to a longitudinal axis of said film.

7. The electrode of claim 1, further comprising a first terminal bar and wherein said ohmic contact means provides for ohmic contact of said wires to said first terminal bar.

8. The electrode of claim 7, wherein said first terminal bar comprises first and second metallic frames and an insulating film between said first and second metallic frames.

9. The electrode of claim 7, wherein said first terminal bar extends transversely to said wires embedded in said adhesive layer.

10. The electrode of claim 1, further comprising a first terminal bar on said planar surface of said film, said first terminal bar having a longitudinal portion extending generally parallel to said wires embedded into said adhesive layer and a plurality of spaced apart transverse portions connected to said longitudinal portion and sufficiently spaced apart such that respective photovoltaic elements can be received between adjacent transverse portions, and wherein said ohmic contact means is operable to cause said part of the surfaces of said wires protruding from said adhesive layer to make ohmic contact with said transverse portions.

11. The electrode of claim 1, further comprising an outer plurality of substantially parallel wires extending generally perpendicularly to said plurality of wires embedded into said adhesive layer to form a wire mesh.

12. The electrode of claim 11, wherein said outer wires have portions embedded into said adhesive layer.

13. The electrode of claim 11, further comprising second ohmic contact means on said outer plurality of wires, said second ohmic contact means being operable to cause said outer plurality of wires to make ohmic contact with the electrically conductive surface of the photovoltaic element.

14. The electrode of claim 13, wherein at least one of said first and second ohmic contact means provides for ohmic contact between said wires embedded into said adhesive layer and said outer plurality of wires.

15. The electrode of claim 14, wherein said second ohmic contact means comprises a second coating on said outer plurality of wires, said coating comprising an alloy having a low melting point, operable to solder said outer plurality of wires to the electrically conductive surface of the photovoltaic element.

16. The electrode of claim 13, further comprising a first terminal bar on said planar surface of said film, said first terminal bar being formed into a U-shaped frame having a base and first and second free legs said first ohmic contact means causing ohmic contact of said wires embedded in the adhesive layer with the base and said second ohmic contact means causing ohmic contact of said wires of the outer plurality of wires with at least one of said first and second free legs.

17. The electrode of claim 13, further comprising first and second terminal bars, wherein said first ohmic contact means provides for ohmic contact of said wires embedded in said adhesive layer to said first terminal bar and wherein said second ohmic contact means provides for ohmic contact of said outer plurality of wires to said second terminal bar.

18. The electrode of claim 17, wherein said first and second terminal bars are electrically connected to each other.

19. The electrode of claim 17, wherein said first terminal bar is positioned at ends of said wires embedded into the adhesive layer and wherein said second terminal bar is positioned at ends of said outer wires.

20. The electrode of claim 17, wherein the first and second terminal bars are disposed outside an outer perimeter of the photovoltaic element.

21. The electrode of claim 17, wherein the first and second terminal bars are disposed at an angle to each other.

22. The electrode of claim 13, further comprising an angularly formed terminal bar, comprising first and second terminal bar portions, wherein said first ohmic contact means provides for ohmic contact of said wires embedded in said adhesive layer to said first terminal bar portion and wherein said second ohmic contact means provides for ohmic contact of said outer plurality of wires to said second terminal bar portion.

23. A photovoltaic system comprising:
a terminal bar formed into a closed frame, said closed frame having an open area;
a first photovoltaic element in said open area, said first photovoltaic element having a first electrically conductive surface; and
an electrode comprising:
an electrically insulating optically transparent film having a planar surface;
an adhesive layer on said planar surface;
a plurality of substantially parallel, electrically conductive wires lying over said planar surface of said film and embedded into said adhesive layer, said adhesive layer having a thickness less than a thickness of said wires embedded therein, such that a part of the surfaces of said wires protrudes from said adhesive layer; and
first ohmic contact means for causing said part of the surfaces of said wires protruding from said adhesive layer to make ohmic contact with the first electrically conductive surface of said first photovoltaic element and to make ohmic contact with said terminal bar;
said adhesive layer being operable to adhesively secure said film to said first electrically conductive surface while said ohmic contact means causes said part of the surfaces of said wires protruding from said adhesive layer to make ohmic contact with said first electrically conductive surface of the first photovoltaic element and said terminal bar.

24. The system of claim 23, wherein said terminal bar has a second open area, and further comprising a second photovoltaic element having a second electrically conductive surface, in said second open area, and wherein said first ohmic contact means is operable to cause said part of the surfaces of said wires protruding from said adhesive layer to make ohmic contact with said second electrically conductive surface of the second photovoltaic element.

* * * * *